United States Patent
Boer et al.

(10) Patent No.: US 6,511,860 B1
(45) Date of Patent: Jan. 28, 2003

(54) METHOD FOR MANUFACTURING A THERMOPILE ON AN ELECTRICALLY INSULATING SUBSTRATE

(75) Inventors: Hendrik Jan Boer, Lochem (NL); Frederik Van Der Graaf, Zuidland (NL); Boudewijn Martinus, Rosmalen (NL)

(73) Assignee: Berkin, B.V., Ruurlo (NL)

( * ) Notice: Subject to any disclaimer, the term of this patent is extended or adjusted under 35 U.S.C. 154(b) by 156 days.

(21) Appl. No.: 09/624,340

(22) Filed: Jul. 24, 2000

(30) Foreign Application Priority Data

Jul. 26, 1999 (NL) ............................................. 1012709

(51) Int. Cl.7 ........................... H01L 21/00; H01L 35/00
(52) U.S. Cl. ........................... 438/54; 438/55; 136/224; 136/225
(58) Field of Search .......................... 438/54, 48, 622, 438/55; 136/224, 225, 227

(56) References Cited

U.S. PATENT DOCUMENTS

| 4,085,613 A | * | 4/1978 | Richard ........................ 375/39 |
| 4,343,960 A | * | 8/1982 | Eguchi et al. ............... 136/225 |
| 5,017,509 A | * | 5/1991 | Tuckerman .................. 438/622 |
| 5,244,837 A | * | 9/1993 | Dennison ..................... 438/622 |
| 5,591,673 A | * | 1/1997 | Chao et al. .................. 438/631 |
| 5,780,746 A | * | 7/1998 | Brady .......................... 73/766 |
| 5,909,004 A | * | 6/1999 | Hedengren et al. ......... 136/201 |
| 6,204,502 B1 | * | 3/2001 | Guilmain et al. ........... 250/353 |

FOREIGN PATENT DOCUMENTS

| EP | 0 030 499 A2 | 6/1981 |
| EP | 0 269 485 A1 | 6/1988 |
| EP | 760530 A1 | * 3/1997 ........... H01L/35/32 |
| GB | 2 218 261 A | 11/1989 |
| WO | 84/02037 | 5/1984 |

* cited by examiner

Primary Examiner—Matthew Smith
Assistant Examiner—Lex H. Malsawma
(74) Attorney, Agent, or Firm—Young & Thompson

(57) ABSTRACT

Method for manufacturing a thermopile on an electrically insulating substrate. A pattern is arranged on this substrate of parts which consist of a first conductive material, to which a second conductive material is applied, and parts which consist only of the first conductive material. The second material is better electrically conducting than the first and, connected as thermopile, can thereby generate a certain thermo-voltage. The second material is applied to the first, starting from a layer of the first material on the substrate, by etching stripes therein via the so-called "blind-hole etching" technique and applying the second material in these stripes.

7 Claims, 3 Drawing Sheets

METHOD FOR MANUFACTURING A THERMOPILE ON AN ELECTRICALLY INSULATING SUBSTRATE

FIELD OF THE INVENTION

The invention relates to a method for manufacturing a thermopile on an electrically insulating substrate, wherein the starting point is such a substrate having thereon a layer of a first electrically conductive material, to which material a first sensitive lacquer coating is applied which is selectively removed using a mask for placing onto this lacquer coating, whereafter at those positions where the lacquer coating is removed a second electrically conductive material is applied to said first material, wherein the second material is better electrically conducting than the first material and the first and second material, connected as thermocouple, generate a certain thermo-voltage, the remaining part of the lacquer coating is then removed and a fresh—second—lacquer coating is applied over the whole film surface which, using a second mask to be laid onto this lacquer coating, is again also selectively removed in the sense that the lacquer coating remains intact above the second material and above determined positions above the first material which are determined via the mask and which do not make electrical contact with the second material, whereafter the first material not coated by lacquer is finally etched away and the lacquer is then removed.

BACKGROUND OF THE INVENTION

Such thermopiles are applied for instance in sensors for thermophysical instruments such as flow-meters, with which flow rates of gas or liquid flows—quantities of gas or liquid which flow through a conduit per unit of time—are measured.

The manufacture of thermopiles of the above stated type is described for instance in the European patent no. 760530.

A film of a polyimide material is for instance used as substrate. A layer of the first electrically conductive material is applied to one side thereof. A film thus results consisting of a substrate having thereon a first conductive material and an optionally present glue layer.

Once the film has been degreased, a photosensitive lacquer coating is applied to the side thereof on which the first material is situated, this in the sense that when the lacquer coating is exposed and sets at the exposed locations, the lacquer on the unexposed locations can be washed away—a so-called negative lacquer—or precisely the reverse: that the lacquer on the exposed positions can be washed away, a so-called positive lacquer. Exposure usually takes place via a mask with the exposure pattern laid on the first material. The lacquer is then developed in the developer medium prescribed by the manufacturer of the lacquer.

The thus obtained film, which except for the parts which must be coated with a layer of the second material, is coated with lacquer, is now subjected to a galvanizing process: stripes of the second material are grown on the uncovered first material. The height of the stripes to be thus produced is found to be limited by requirements imposed during a second coating with lacquer, later in the manufacturing process, on the volume of air bubbles enclosed particularly during application of the second material: about 12 $\mu$m above the first material was found to be the maximum attainable.

After the stripes of the second material have been applied the remaining lacquer is removed. This takes place in an alkaline "stripper" and for as short a time as possible, in order to prevent the glue with which the first material is glued to the substrate from dissolving in the stripper. The subsequent application of the second lacquer coating, selective removal thereof via a second mask, etching away of the uncovered first material and, finally, removal of the lacquer also form part of the prior art.

The limitation in the possible height of the stripes, and therewith of the ratio of the quantities of the second material to those of the first, is a great drawback of the above described known method. In the case of a layer of the first material of 10 $\mu$m thickness and a 12 $\mu$m thick layer of the second material (the maximum thickness), said ratio thus amounts to (1:1.2). An increase in the ratio of the thickness of the second material to that of the first material would result in a better functioning thermocouple.

SUMMARY OF THE INVENTION

The invention is based on the insight that it is possible using a per se known technique, i.e. so-called "blind-hole etching", to make thermopiles with a greatly increased ratio of the thickness of the layer of the second material to that of the first material compared with the known thermopiles. Blind-hole etching is understood to mean etching away material to a certain depth: there remains as it were a bottom with a certain thickness.

The method according to the invention has for this purpose the feature that after the first lacquer coating has been selectively removed, at the positions where this has occurred the first electrically conductive material—preferably constantan—is etched away to a predetermined depth and only then is the second electrically conductive material—preferably copper—applied respectively introduced at these positions. The polyimide material of the substrate is preferably "Kapton".

For the materials in question the representatives thereof, i.e. constantan, copper and Kapton, will be used in each case hereinbelow. The invention is however not limited to the use of these materials.

By means of etching a type of channel is arranged in the constantan in which the copper is "grown"—the constantan layer thus becomes thinner at this position and the above stated ratio of the thicknesses thus becomes more favourable: a constantan layer of for instance 10 $\mu$m thickness can then be etched away to a thickness of for instance 5 $\mu$m, whereafter a layer of copper of 15 $\mu$m thickness is applied. This results in a ratio of copper thickness: constantan thickness=3:1.

During etching according to the invention the etching depth is often found difficult to define: a desired depth of for instance 5 $\mu$m can easily become 4 $\mu$m or 6 $\mu$m. By starting from a thicker layer of constantan, which is possible when the etching technique is used,—for instance with a thickness of 25 $\mu$m, wherein the etching depth can then be a maximum of 18 $\mu$m—the influence of this inaccuracy of the etching depth on the relevant ratio can be reduced. An associated thickness of the film is for instance 100 $\mu$m.

It is thus possible in theory, with a thickness of the constantan layer of 25 $\mu$m, at an etching depth of 18 $\mu$m—and therefore with a remaining constantan thickness of 7 $\mu$m—and with a "build-up" of the copper above the constantan of 10 $\mu$m, to achieve a thickness ratio of copper:constantan=28:7=4:1. This is however found to be not wholly realizable in practice since the etched channel does not have a wholly rectangular section perpendicularly of its length direction but is slightly sloping. This pattern is repeated in the grown copper, whereby said ratio will be smaller in practice.

It is recommended to first thoroughly clean the etched constantan surface prior to growing copper thereon: fine dirt particles and also air in the stripes can result in gaps in the copper. In a preferred embodiment the method according to the invention is therefore characterized in that, after etching of the constantan and prior to copper-plating, the etched surface is cleaned by first immersing it in a solution of diluted nitric acid, whereafter it is washed with water and dried.

The copper-plating is for instance realized in an acid copper bath for several tens of minutes. It is found possible to thus realize thermopiles with a regularly distributed copper layer, without rough spots.

The invention comprises a thermopile manufactured using the above described method or embodiment thereof—and the invention also comprises flow-meters equipped with a thermopile according to the invention.

BRIEF DESCRIPTION OF THE DRAWINGS

The invention will be further elucidated with reference to the drawings, in which.

DETAILED DESCRIPTION OF THE INVENTION

Figure 1:
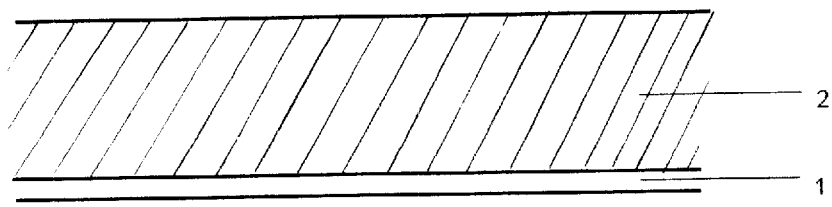
FIGS. 1–10 show schematically the successive steps in the process followed in the manufacture of a copper/copper-constantan thermopile according to the invention, starting from an electrically insulating substrate to which a layer of constantan is applied.

FIG. 1 shows the electrically insulating substrate 1—for instance Kapton—onto which constantan layer 2 is applied, for instance by glueing. A thickness of the constantan layer of 25 $\mu$m is found to suffice.

Figure 2:
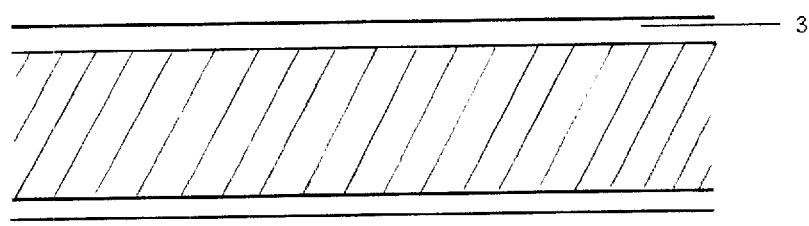

FIG. 2 shows the film according to FIG. 1, but now coated with lacquer coating 3. The lacquer used is preferably a lacquer which can be set by exposure thereof and is arranged on a degreased and washed-clean under-layer of constantan.

Figure 3:
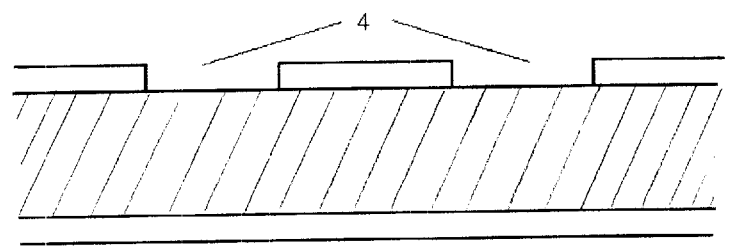

FIG. 3 shows the film coated with lacquer according to FIG. 2, wherein the lacquer is removed in accordance with a determined pattern made in a mask which is placed on lacquer coating 3: when a so-called negative lacquer is used the parts 4 not exposed via the mask and thus not set are washed away.

Figure 4:
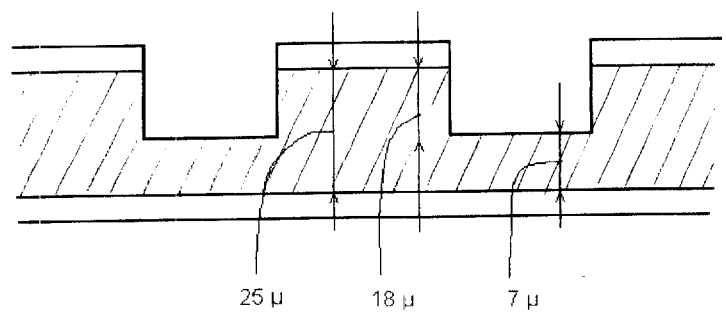

FIG. 4 shows how at the positions where the lacquer coating is removed and the constantan thus lies uncovered, this constantan is etched away to a certain depth. With a constantan thickness of 25 $\mu$m, etching away to a depth of 18 $\mu$m—and therefore until a constantan layer of 7 $\mu$m remains—is possible.

Etching can take place in per se known manner with an etching agent on a basis of $FeCl_3$ at a temperature of about 40–50° C.

Figure 5:
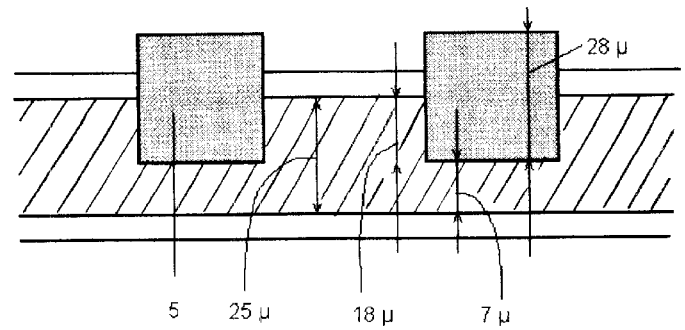
Figure 6:
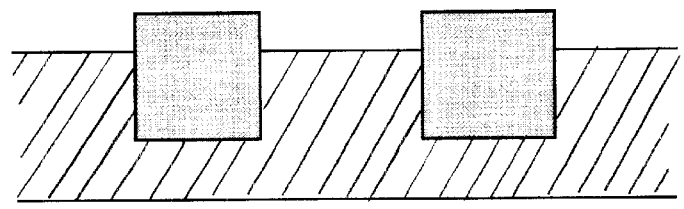
Figure 7:
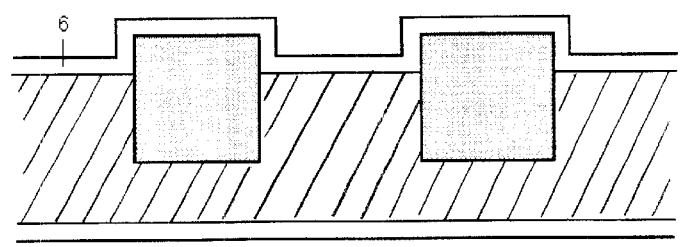
Figure 8:
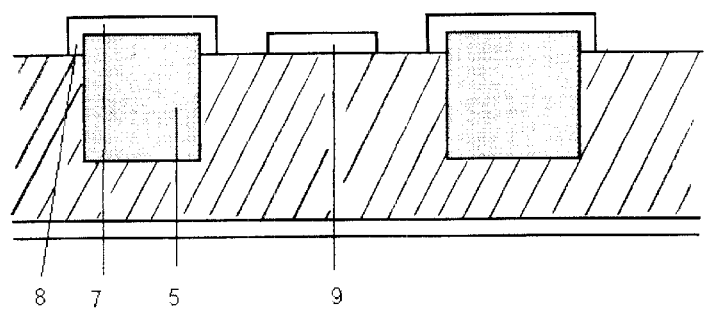

FIG. 5 shows the situation, after copper-plating, which occurs after the—etched—metal surface is first pre-treated respectively cleaned (for instance immersion in a solution of nitric acid in water, followed by washing with water and drying).

Copper-plating takes place in known manner, for instance in an acid copper bath. The longer copper-plating continues, the thicker the copper layer becomes. For instance: 20 minutes results in 13 $\mu$m; 30 minutes results in 20 $\mu$m, etc.

With a film as shown in FIG. 4 a copper stripe thickness of 28 $\mu$m is possible, which results in a ratio copper:constantan of 28:7=4:1.

FIGS. 6, 7, 8, 9 and 10 show how, using per se known process steps, the thermopile is made from the film according to FIG. 5. The lacquer adjacent to the copper stripes is first removed—FIG. 6. A fresh lacquer coating 6 is then applied over the whole surface—FIG. 7. Portions of this fresh lacquer coating 6 are again removed selectively—using a mask. What remains is the lacquer 7 on copper stripes 5 and protruding slightly therefrom 8 and at positions therebetween 9 at a distance from copper stripes 5—FIG. 8.

Figure 9:
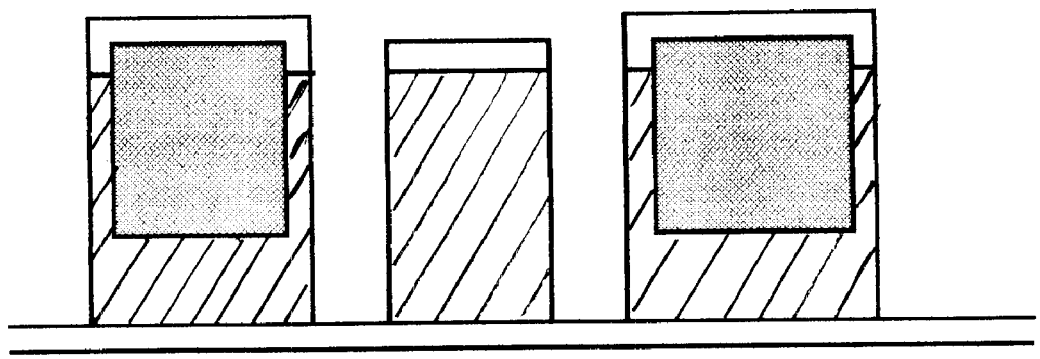

FIG. 9 shows the situation after etching away of the constantan on the portions not coated with lacquer.

Figure 10:
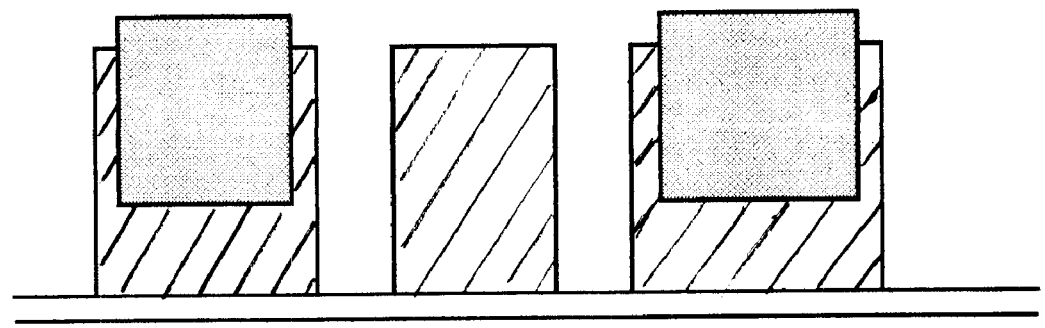

In FIG. 10 all lacquer has been removed with a stripper and the film is ready for use as thermopile.

What is claimed is:

1. A method for manufacturing a thermopile comprising a plurality of thermocouples, which method comprises the steps of:

providing an electrically insulating substrate having thereon a layer of a first conductive material;

applying a first photosensitive lacquer coating and selectively removing the first lacquer coating using a mask that is placed onto the first lacquer coating;

etching the first conductive material at the positions where said selective removal has occurred until a predetermined thickness remains, thus forming recesses;

growing a second electrically conductive material on said first material in positions where it was recessed, where the second material is a better electrically-conductive material than the first material, wherein the first and second materials, if connected as a thermocouple, generate a certain thermo-voltage, and wherein the thickness of the second conductive material is greater than the remaining thickness of the first conductive material;

removing the remaining part of the first lacquer coating;

applying a fresh second lacquer coating over the whole film surface and selectively removing the second lacquer coating using a second mask, wherein the second lacquer coating remains intact above the second material and above the first material in predetermined positions where the first material does not make electrical contact with the second material, wherein said predetermined positions are determined via the second mask, etching the first material not coated with the second lacquer away and removing any remaining portions of the second lacquer.

2. A method as claimed in claim 1, wherein the substrate consists of Kapton, the first material is constantan and the second material copper, the constantan has a thickness of 10 $\mu$m and is etched away until a bottom thickness of 5 $\mu$m is reached, and the height of the copper is 15 $\mu$m.

3. A method as claimed in claim 1, wherein as starting substrate is used a film with a constantan layer with an initial thickness of more than 10 $\mu$m, and etching takes place until a constantan thickness of 7 $\mu$m remains.

4. A method as claimed in claim 3, wherein said initial thickness of said constantan layer is 25 $\mu$m.

5. A method as claimed in claim 1, wherein the ratio of the thickness of the second conductive material to the remaining thickness of the first conductive material is greater than 1.2:1.

6. A method as claimed in claim 5, wherein the ratio is 4:1 at most.

7. A method as claimed in claim 1, wherein the thickness of the second conductive material is greater than the depth of the recesses in the first conductive material.

* * * * *